United States Patent [19]
Smith

[11] 3,835,395
[45] Sept. 10, 1974

[54] TELEVISION CHANNEL INDICATING TAB WITH AUTOMATIC VHF/UHF SWITCHING

[75] Inventor: Dennis D. Smith, Skokie, Ill.

[73] Assignee: Zenith Radio Corporation, Chicago, Ill.

[22] Filed: Sept. 4, 1973

[21] Appl. No.: 394,034

[52] U.S. Cl. ................. 325/459, 325/455, 325/465, 334/15, 334/87
[51] Int. Cl. ............................ H04n 5/50, H03j 5/12
[58] Field of Search ..... 178/DIG. 15; 325/455, 459, 325/464, 465; 334/15, 86, 87

[56] References Cited

UNITED STATES PATENTS

| | | | |
|---|---|---|---|
| 3,707,941 | 1/1973 | Kunishige et al. | 325/455 |
| 3,721,926 | 3/1973 | Berenbaum et al. | 325/464 |
| 3,767,112 | 10/1973 | Tohari | 325/459 |

*Primary Examiner*—Richard Murray
*Assistant Examiner*—Marc E. Bookbinder
*Attorney, Agent, or Firm*—Nicholas A. Camasto; John J. Pederson

[57] ABSTRACT

A combination UHF-VHF television tuner system has a plurality of tuning positions each including an individual potentiometer for adjusting the tuning voltage of an appropriate varactor-diode tuner, and a flexible plastic channel number indicator tab, which when illuminated, yields a visible indication of the tuning position selected and the channel number of the television signal programmed at the selected tuning position. A common contact strip is provided at the tuning positions for switching between UHF and VHF operating modes and each tuning position also includes an individual spring contact, self-biased into engagement with the common contact. The channel number indicator tab is coded in accordance with its channel number designation to selectively separate the individual and common contacts. In the preferred embodiment, the indicator tab has an aperture permitting engagement of the individual and common contacts.

7 Claims, 5 Drawing Figures

TELEVISION CHANNEL INDICATING TAB WITH AUTOMATIC VHF/UHF SWITCHING

BACKGROUND OF THE INVENTION

Current television receivers include voltage controllable varactor diodes as the frequency determining element of the tuners. Varactor diodes exhibit a capacity change in accordance with the DC voltage impressed thereacross and consequently may be used in conjunction with inductances for tuning purposes.

Because of the wide range of frequencies allocated for VHF and UHF television channels, separate varactor-diode tuners are generally employed to tune channels in the VHF and UHF bands. It is also customary to operate the VHF tuner as an amplifier when the receiver is working in the UHF mode. These tuner systems require some type of switching for selecting between the VHF and UHF operating modes.

Rarely more than a handful of the 82 allocated television channels are ever receivable in any given geographical area. It is, therefore, common practice to provide the receiver with a limited number of tuning positions of which any desired channel may be received. For example, the television receiver may have 14 tuning positions each individually programmable to receive any of television channels 2–83 (which covers the entire VHF-UHF spectrum). Each tuning position may be reached or accessed by a mechanical or electronic switch and when so accessed includes means connecting a variable DC voltage device, such as a potentiometer, for applying an appropriate tuning voltage to the varactor diode in the tuner.

Prior art receivers include a plurality of replaceable channel number indicator tabs (and appropriate instructions) enabling the viewer to "set up" the receiver in accordance with his own television channel viewing preference. With such receivers, the viewer may, if he likes, program the receiver to receive any desired television channels in any sequence of his choosing. These are similar to the old station tabs used with push button radios.

Because of the "Equal Tuning" requirements of the FCC (Federal Communications Commission), most such receivers include a pointer and channel number indicator scale to assist the viewer in coarsely tuning the receiver by observation of the position of the pointer on the scale. Since multiple bands (UHF and VHF) are involved, the receivers may also be provided with a switch at each tuning position for selecting between VHF and UHF operating modes. The tuning indicator may have two scales, one for VHF and the other for UHF channels and the viewer obviously must observe the appropriate scale when programming the tuner. Fine tuning is accomplished by visual observation of the received picture and is often supplemented by some form of automatic frequency control.

The prior art also includes a system incorporating a combined channel indicator and coarse tuning circuit in the form of a rigid printed circuit board with a metallic wiring pattern on a translucent substrate. One board is provided for each of channels 2–83. Each board includes a number of resistive components, a channel number display area, and an edge connection area having a plurality of printed circuit male contacts electrically connected to the resistive components. The channel number consists of an unconnected metallic foil representation which is opaque to light. Insertion of a channel indicator board into a corresponding female contact assembly at each tuning position connects the appropriate voltage divider resistors to the varactor tuner (which is fine tuned by an additional variable potentiometer) and also completes the electrical switching circuit for changing between UHF and VHF operating modes in accordance with the number on the channel indicator board. A light source, located behind the channel indicator board at each tuning position, is illuminated when its tuning position is operative, to display the channel number in the display area of the printed circuit board. Such channel indicator members are bulky, expensive and require complex and expensive switching terminals at each tuning position. Further, the necessity of supplying 82 such boards with each receiver—even though a small fraction thereof will be needed—poses substantial cost problems. Any attempt to select groups of indicator boards for particular geographical areas poses insuperable logistic problems.

SUMMARY OF THE INVENTION

In accordance with the present invention the channel number indicator tabs comprise very inexpensive flexible rectangular strips, made entirely of plastic, bearing a pattern of opaque and transparent areas defining a channel number suitable for display in conjunction with a light source. The tabs are insertable in any of a plurality of tuning positions on the receiver and include locking apertures cooperating with the control panel assembly for maintaining them in position. Each tuning position includes an individual spring contact self-biased into engagement with a contact plate common to all tuning positions. The tabs are all designed to separate these contacts upon insertion. Certain tabs include a switching aperture permitting re-engagement between the individual and common contact in accordance with the channel number on the tab. Thus, the viewer is spared the necessity of determining the proper position for the VHF-UHF switch during tuning and a great deal of viewer confusion is thereby avoided. The cost of providing a sheet of 82 plastic tabs is very minimal. Indeed, it is not uncommon to provide multiple sheets so that two or three of the 14 tuning positions may be tuned to the same channel.

OBJECTS OF THE INVENTION

Accordingly, it is a principal object of this invention to provide an improved television receiver.

A further object of this invention is to provide an improved television receiver with an economical method of programming UHF and VHF channels.

BRIEF DESCRIPTION OF THE DRAWINGS

Further objects of this invention will become apparent upon reading of the specification in conjunction with the drawings in which.

DESCRIPTION OF THE PREFERRED EMBODIMENTS

Figures 1, 3, 4:
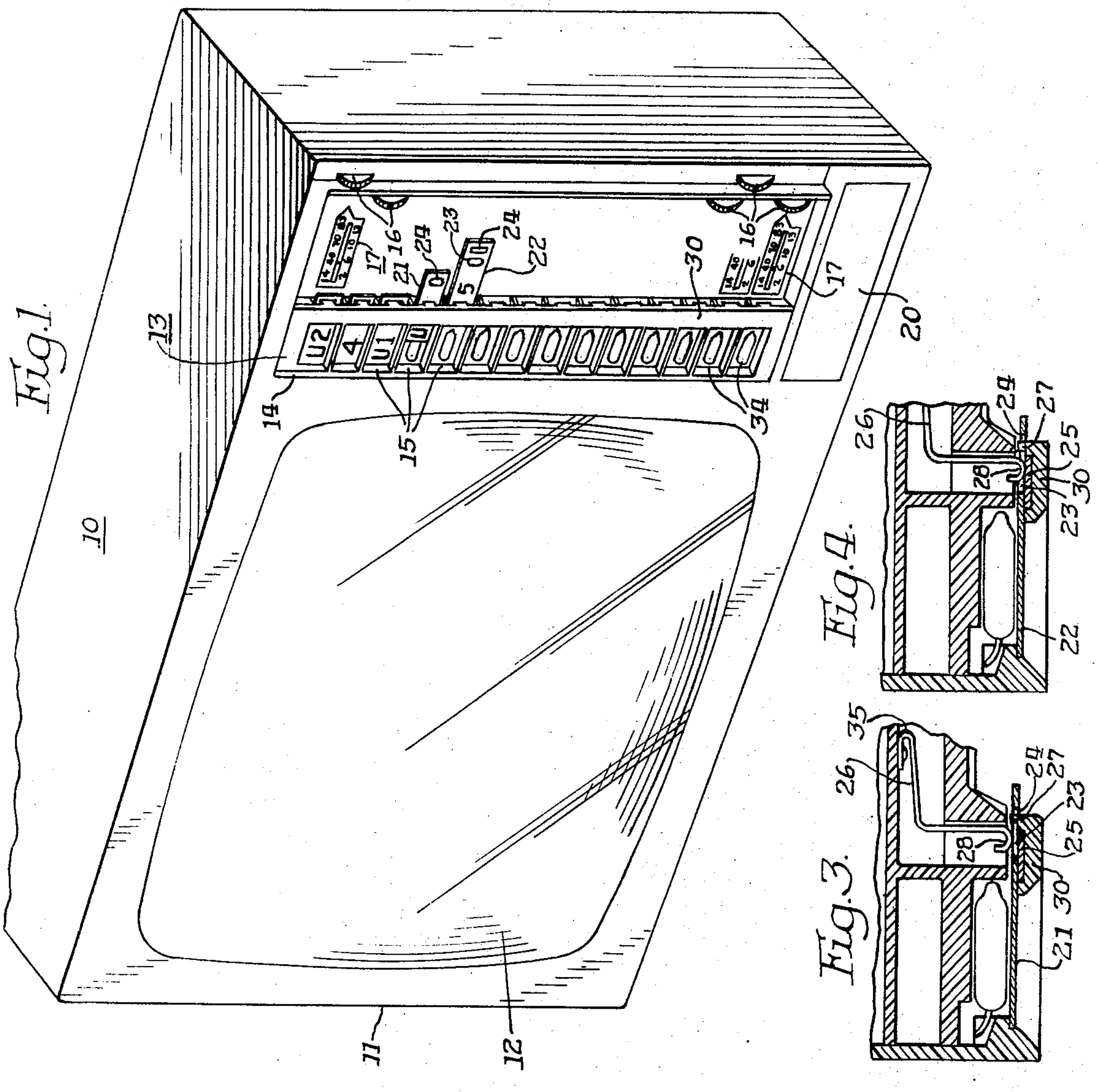
FIG. 1 depicts a television receiver with a partial view of a control panel incorporating the invention.
FIG. 3 is a partial sectional view through a tuning position of the control panel programmed for receipt of a UHF television signal.
FIG. 4 is a partial sectional view through a tuning position of the control panel programmed for receipt of a VHF television signal.

Referring now to FIG. 1, a television receiver 10 includes a cabinet 11 housing a picture tube 12 and a control panel 13. The control panel is shown with some of the channel number indicator tabs removed and some partially removed in the plurality of tuning positions 15. A corresponding plurality of potentiometers (not shown) are accessible by thumb wheels 16, with an individual potentiometer and thumb wheel being provided at each tuning position. Each tuning position likewise includes a tuning indicator scale. For clarity, only a representative number of tuning indicator scales are shown.

An overlay 14 defines a window at each tuning position. An individual one of a corresponding plurality of lamps 34 is located behind each window. A plurality of channel indicator tabs bearing channel number designations is provided, each being insertable between overlay 14 and lamp 34 in each tuning position 15. Indicator tabs bearing UHF channel number designations (U1 and U2 shown) are identified by reference numeral 21 and indicator tabs bearing VHF channel number designations (4 and 5 shown) bear reference numeral 22. Each tab, irrespective of its channel number designation, includes a locking aperture 24. Each VHF channel number tab further includes a switching aperture 23, to be later described.

A control panel access door 20 is provided in the lower right front portion of the television receiver. It will be recognized that control panel 13 and overlay 14 will, in most cases, be covered with a decorative bezel (not shown) for masking the interior from view. The materials for control panel 13 and overlay 14 are a matter of choice, with plastic being preferred. In practice, the bezel will include a door to permit access to the channel number indicator tabs and thumb wheels of the control panel during "set up" or programming of the television receiver. Similarly, the mechanism for selecting the tuning positions is preferably included behind control panel access door 20 and may comprise, for example, a single knob, multi-pole switch. (The switch, of course, may be operable from a position remote from the television receiver by including suitable remote control apparatus.) Other functional controls, such as those for adjusting brightness, contrast, volume, on/off and in a color receiver, saturation and hue, are also preferably located behind the control panel access door. Details of such apparatus are unnecessary to an understanding of this invention and are omitted for the sake of clarity.

Figure 2:
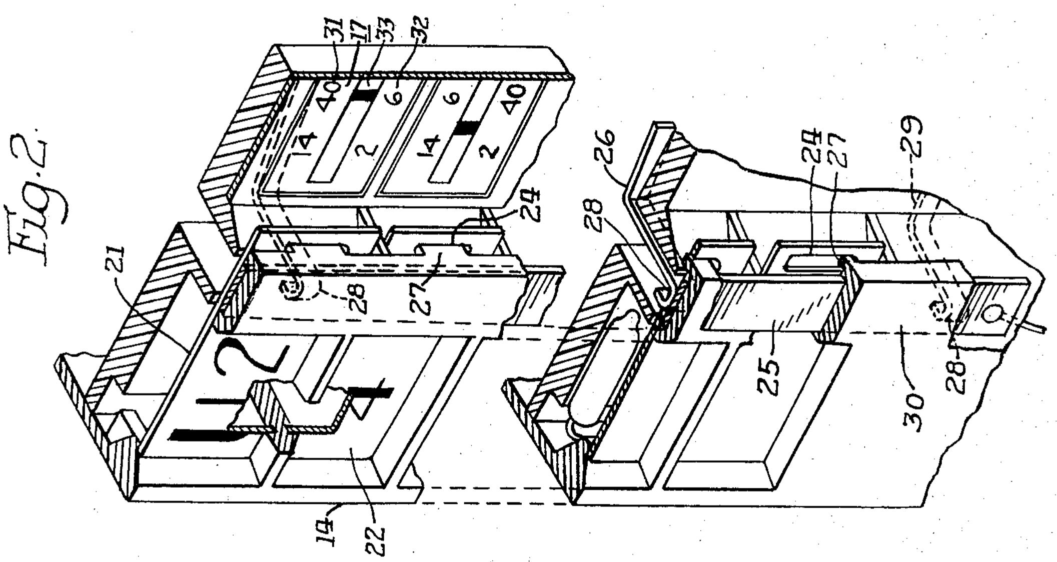
FIG. 2 is an enlarged perspective view of a portion of the control panel of FIG. 1.

FIG. 2 represents an enlarged partial perspective of the control panel and overlay showing the manner in which overlay 14 defines a window about each tuning position 15 and the details of the location and function of the channel indicator tabs. It will be seen that each indicator tab includes a locking aperture 24 which is engageable with a corresponding locking projection 27 formed in a vertical member 30 on overlay 14. The cooperation of the locking projections and apertures preclude inadvertent removal or movement of the channel indicator tab from its correct position in the window. Should it be desired to remove an indicator tab, the viewer need only depress the end portion thereof (rearwardly in the drawing) and slide the tab out. The inner side of vertical member 30 includes a common conductor or contact 25 which extends the full length thereof. In the disclosed embodiment, common contact 25 comprises a metal strip which is fastened by any convenient means to the inner side of vertical member 30, for example, by deforming a rearwardly extending plastic projection on vertical member 30, over the edges of an appropriate hole in the metal strip. Common contact 25 may also take the form of a conductive coating on the inner surface of vertical member 30. The lower portion of common contact 25 is connected by any suitable means, such as soldering, to a wire for connection in an electrical circuit to be described later.

Each tuning position includes an angled individual contact 26, fabricated of narrow spring-tempered metal, having a hooked or bent end portion 28 projecting into engagement with common contact 25. In the absence of a channel number indicator tab, the self-bias of individual contact 26 forces bent portion 28 into engagement with common contact 25. Thus, at each window, in the absence of a channel indicator tab, an electrical connection exists between each individual contact 26 and common contact 25.

The channel indicator tabs comprise substantially rectangular strips of flexible plastic material each bearing a channel number designation. In the illustration of FIG. 2, the upper indicator tab bears the channel number designation U2 and the second tab bears the channel number designation 4. These designations may be formed by opaque areas defining the number on a translucent background or by translucent areas forming the number on an opaque background. It will be appreciated that the designation U1 and U2 are representative only and that in practice each UHF channel indicator tab would bear a number between 14 and 83. Also, each tuning position includes a lamp 34 for illumination thereof, upon selection, and for yielding a visible indication of the number of the television channel programmed thereat. As will be described in further detail with reference to FIGS. 3 and 4, the indicator tabs associated with the UHF channels are designated by reference numeral 21 and are designed to interrupt the electrical connection between bent portion 28 of the individual contact at that tuning position and common contact 25. On the other hand, indicator tabs bearing VHF channel number designations are designed to allow contact between the corresponding individual contact and the common contact. Additionally, at the lower portion of the figure, a return contact 29 is shown making a permanent electrical contact at the bottom of the common contact 25.

Alongside each tuning position is a partially illustrated tuning indicator 17. The tuning indicator includes a pointer 33 which is movable over a pair of scales bearing channel number designations. A VHF scale 32 covers the VHF range of channel numbers (2–13) and the UHF scale covers the UHF channel numbers (14–83). In initially programming the receiver (or reprogramming) an indicator tab designating the desired television channel is inserted in the selected tuning position. As will be explained later, the insertion of the channel number indicator tab automatically determines the appropriate VHF or UHF operating mode. The appropriate potentiometer adjustment thumb wheel 16 is rotated until pointer 33 is in the appropriate range of the television channel number desired as indicated by the corresponding scale 31 or 32. Slight adjustment of the potentiometer serves to fine tune the received television picture in accordance with viewer preference, or as is often the case, an automatic lock-in arrangement (AFC) may be activated to "fine" tune the receiver.

FIG. 3 is a partial sectional view through a tuning position at which a television channel falling in the UHF range is programmed. As will be seen, UHF channel number indicator tab 21 separates bent portion 28 of individual contact 26 and common contact 25, thus breaking the electrical connection therebetween. Overlay 14 may be separably attached to control panel 13 by any suitable means.

FIG. 4 is a partial sectional view through a tuning position which is programmed to receive a television signal in the VHF range and includes a VHF channel indicator tab 22. Switching aperture 23 in the VHF indicator tab allows bent portion 28 of the individual contact to make electrical connection with common contact 25. Note also the arrangement of individual contact 26 at its other end 35 where it is fastened to the control panel structure. This type of mounting may be used for all individual contacts 26. For the sake of clarity, electrical connections to the contacts have been omitted. The resilience of contact 26 continuously urges bent portion 28 toward common contact 25. Both figures also illustrate the manner of engagement between the locking projections 27 and the locking apertures 24.

Figure 5:
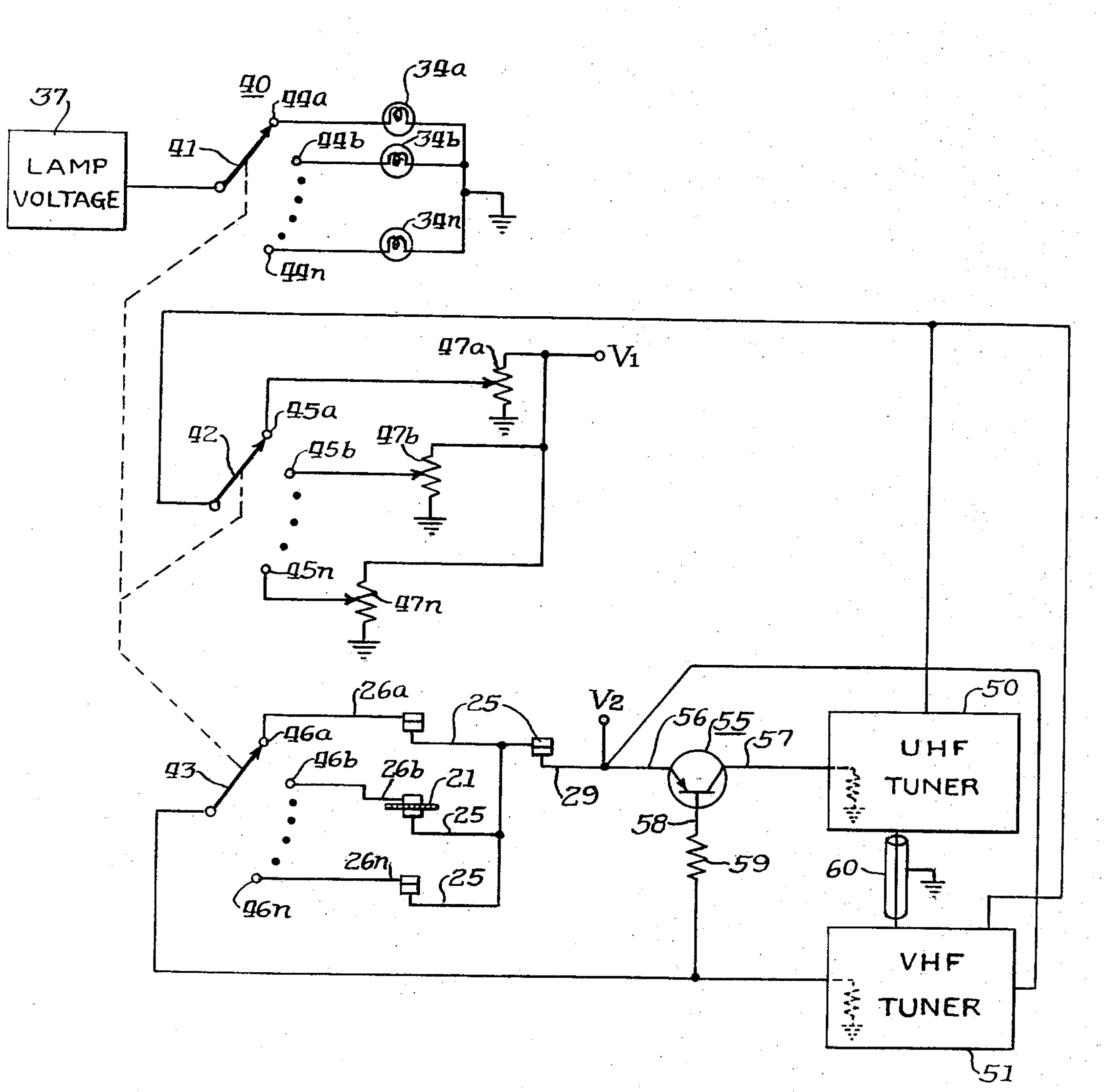
FIG. 5 is a schematic diagram indicating the electrical wiring connections for the combined UHF-VHF television tuner system.

In FIG. 5, a partial schematic diagram of the switching arrangement used in conjunction with the invention is shown. A rotary switch 40 includes a lamp wiper 41, a tuning voltage wiper 42 and a mode selector wiper 43 which, as indicated by the dashed line joining them, are commonly actuatable over a corresponding plurality of contact sets 44, 45 and 46, respectively. The wiper of each contact set is sequentially movable over its corresponding plurality of contacts. For example, lamp wiper 41 is movable over contacts 44*a*, 44*b*...44*n*. Each of these contacts is connected to a lamp 34*a*...34*n*, the other terminals of the lamps being connected to ground. A source of lamp voltage 37 is connected to wiper 41 and, depending upon the position of wiper 41 with respect to the contacts 44, the corresponding one of lamps 34 will be illuminated. The letter designations *a*, *b*...*n* may be understood to indicate the tuning positions on the television receiver.

Tuning voltage wiper 42 is also sequentially movable over a plurality of contacts 45*a*, 45*b*...45*n*. Each of these contacts is connected to the adjustable element of a corresponding one of a plurality of tuning potentiometers 47*a*, 47*b*...47*n*. The fixed resistance portions thereof are connected between a source of voltage $V_1$ and ground and the tuning voltage supplied to wiper 42 is fed to a UHF tuner 50 and a VHF tuner 51.

Mode selector wiper 43 is similarly sequentially movable over contacts 46*a*, 46*b*...46*n*, each of which is connected to a separate one of individual contacts 26. Common contact 25 is illustrated, for convenience, as a plurality of separate contacts, all connected to a source of voltage $V_2$ through return contact 29. A switching transistor 55 is provided with an emitter electrode 56 connected to $V_2$, a collector electrode 57 connected to UHF tuner 50 and a base electrode 58 connected, through a resistor 59, to both VHF tuner 51 and mode selector wiper 43. Additionally, $V_2$ is connected to VHF tuner 51. At contact 46*b* (connected to individual contact 26*b*), there is shown in cross section a UHF indicator tab 21 separating contact 26*b* from common contact 25, and thus breaking the electrical connection therebetween.

The operating voltage for UHF tuner 50 is supplied by voltage source $V_2$ through the emitter-collector junction of transistor 55. Each of the UHF and VHF tuners has an equivalent resistance to ground which is represented by the broken line resistance symbol shown in each of blocks 50 and 51. In the position shown for mode selector wiper 43 (that is, in the *a* position), the lower terminal of resistor 59 is returned to ground through the equivalent resistance of VHF tuner 51. It is also connected via wiper 43 and contact 46*a*, contact 26*a* and contacts 25, and contact 29, back to $V_2$ and emitter 56. Consequently, the potential difference between emitter 56 and base 58 of transistor 55 is substantially zero and transistor 55 remains in a nonconductive state. When transistor 55 is nonconductive, $V_2$ potential is not supplied to UHF tuner 50 and it remains inactive. However, VHF tuner 51 is supplied operating potential from $V_2$ through the contact circuit just described. At the same time, lamp 34*a* is energized, illuminating the tuning position with the channel number of the television signal receivable and tuning potentiometer 47*a* supplied tuning voltage to the tuner.

Assume mode selector wiper 43 is in the *b* position. The $V_2$ potential is not supplied to the jusction of resistor 59 and VHF tuner 51 because the electrical connection between contacts 26b and 25 is broken by UHF channel number indicator tab 21. Consequently, the emitter of transistor 55 is forward biased with respect to its base and the transistor is in conduction, coupling $V_2$ to the UHF tuner. UHF tuner 50 is, therefore, energized.

In the UHF operating mode, the VHF tuner is operated as an amplifier and a separate voltage connection (independent of switching) exists from source $V_2$ to the VHF tuner for operating certain of its circuitry therein as an amplifier. The output signal from UHF tuner 50 is supplied, over a coaxial cable 60, to the VHF tuner.

It will thus be seen that the invention comprises a very simple means for automatically programming a channel tuning position to the correct VHF-UHF operating mode in accordance with the channel number designation on an inexpensive removable channel number indicator tab. The arrangement materially assists the viewer in programming his receiver to receive programs of his choice with a minimum of confusion and does so at minimum cost.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. In a combination UHF-VHF television receiver including a varactor tuner system including VHF and UHF tuners having a plurality of tuning positions each including a potentiometer for programming said varactor tuners to selectively receive any of a plurality of television broadcast channel signals, said tuner system being characterized by switch selected UHF and VHF operating modes; means selectively connecting the potentiometer at each said tuning position to said tuner system; indicator means at each tuning position for visibly indicating the selected tuning position and the designation of the channel programmed thereat, said indicator means comprising a light bulb and a removable channel number indicator tab of flexible insulating material having opaque and translucent areas defining the channel designation; a two position switch at each said tuning position, the positions of said switches determining said UHF and VHF operating modes, each said switch comprising a common contact available to all said tuning positions and a contact spring contacts individual to each position; and means on said indicator tabs interrupting said individual contacts and said common contact in accordance with the channel designations thereon.

2. In a television receiver as set forth in claim 1, further including: a cabinet housing said tuner system and a control panel; and an overlay cooperating with said control panel and defining a plurality of windows individually framing said channel number indicator tabs, said overlay including conductive means defining said common contact.

3. In a television receiver as set forth in claim 2, wherein said spring contacts each comprise a bent metallic member self-biased toward engagement with said common contact; and wherein certain ones of said channel number indicator tabs define apertures through which said individual spring contacts make engagement with said common contact.

4. In a television receiver as set forth in claim 3, wherein said channel number indicator tabs each include a locking aperture; and wherein said overlay includes a locking projection at each said tuning position, said locking apertures and said locking projections cooperating to maintain said channel number indicator tab in position in said window.

5. In a television receiver as set forth in claim 4, wherein said common contact comprises a metal strip affixed to the inner surface of said overlay.

6. In a television receiver as set forth in claim 5, wherein said individual spring contacts each include a bent end portion for engaging said metal strip.

7. In a television receiver as set forth in claim 6, wherein said apertures are in channel number indicator tabs bearing designation in the VHF range, said bent end portions extending through said apertures and engaging said metal strip.

* * * * *